(12) United States Patent
Kautzky et al.

(10) Patent No.: US 11,935,567 B2
(45) Date of Patent: Mar. 19, 2024

(54) SINGLE-GRAIN NEAR-FIELD TRANSDUCER AND PROCESS FOR FORMING SAME

(71) Applicant: Seagate Technology LLC., Fremont, CA (US)

(72) Inventors: Michael Christopher Kautzky, Eagan, MN (US); Tong Zhao, Eden Prairie, MN (US); Li Wan, Prior Lake, MN (US); Xiaolu Kou, Los Gatos, CA (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 17/877,434

(22) Filed: Jul. 29, 2022

(65) Prior Publication Data

US 2022/0366934 A1 Nov. 17, 2022

Related U.S. Application Data

(62) Division of application No. 16/252,167, filed on Jan. 18, 2019, now Pat. No. 11,423,928.

(Continued)

(51) Int. Cl.
*G11B 5/31* (2006.01)
*C30B 25/04* (2006.01)
(Continued)

(52) U.S. Cl.
CPC .............. *G11B 5/314* (2013.01); *C30B 25/04* (2013.01); *G11B 5/105* (2013.01); *G11B 5/1272* (2013.01);
(Continued)

(58) Field of Classification Search
CPC ..... H01L 33/0093; H01L 33/02; C30B 25/04; C30B 25/02; G11B 7/12; G11B 5/314;
(Continued)

(56) References Cited

U.S. PATENT DOCUMENTS 6,248,416 B1 6/2001 Lambeth et al.
6,294,450 B1 9/2001 Chen et al.
(Continued)

FOREIGN PATENT DOCUMENTS

| CN | 104050978 A | * | 9/2014 | ............ G11B 5/115 |
|---|---|---|---|---|
| EP | 1308936 | | 5/2003 | |
| EP | 1308936 A1 | * | 5/2003 | ............ G11B 5/667 |

OTHER PUBLICATIONS

Kim et al., "Printable, Flexible, and Stretchable Forms of Ultrananocrystalline Diamond with Applications in Thermal Management", Advanced Materials, vol. 20, 2008, pp. 2171-2176.
(Continued)

*Primary Examiner* — Jeffrey T Carley
(74) *Attorney, Agent, or Firm* — Mueting Raasch Group

(57) ABSTRACT

A method comprises forming a single-crystal-like metal layer on a metal seed layer, the metal seed layer formed on a carrier wafer. The method comprises forming a first bonding layer on the single-crystal-like metal layer. The method also comprises forming a second bonding layer on a dielectric layer of a target substrate, the target substrate comprising one or more recording head subassemblies. The bonding layers may include diffusion layers or dielectric bonding layers. The method further comprises flipping and joining the carrier wafer with the target substrate such that the first and second diffusion layers are bonded and the single-crystal-like metal layer is integrated with the recording head as a near-field transducer.

11 Claims, 7 Drawing Sheets

Related U.S. Application Data

(60) Provisional application No. 62/619,368, filed on Jan. 19, 2018.

(51) Int. Cl.
    *G11B 5/105*            (2006.01)
    *G11B 5/127*            (2006.01)
    *G11B 5/84*              (2006.01)
    *G11B 7/124*            (2012.01)
    *H01L 33/00*            (2010.01)
    *G11B 5/00*               (2006.01)
    *G11B 5/60*               (2006.01)

(52) U.S. Cl.
    CPC .......... *G11B 5/1278* (2013.01); *G11B 5/3163* (2013.01); *G11B 5/84* (2013.01); *G11B 7/124* (2013.01); *H01L 33/0093* (2020.05); *G11B 2005/0021* (2013.01); *G11B 5/6088* (2013.01)

(58) Field of Classification Search
    CPC ..... G11B 5/105; G11B 5/1272; G11B 5/1278; G11B 5/3163; G11B 5/84; G11B 5/6088; G11B 7/124; G11B 2005/0021
    See application file for complete search history.

(56) References Cited

U.S. PATENT DOCUMENTS

| | | | |
|---|---|---|---|
| 6,376,097 B1 | 4/2002 | Leu et al. | |
| 6,835,464 B2 * | 12/2004 | Ambrose | H01F 10/3218 |
| | | | 428/815 |
| 6,944,112 B2 | 9/2005 | Challener | |
| 7,622,367 B1 | 11/2009 | Nuzzo et al. | |
| 7,972,875 B2 | 7/2011 | Rogers et al. | |
| 7,998,330 B2 | 8/2011 | Fang et al. | |
| 8,261,660 B2 | 9/2012 | Menard | |
| 8,333,860 B1 | 12/2012 | Bibl et al. | |
| 8,456,969 B1 | 6/2013 | Mooney et al. | |
| 8,501,536 B2 | 8/2013 | Mooney et al. | |
| 8,518,204 B2 | 8/2013 | Hu et al. | |
| 8,588,040 B1 * | 11/2013 | Fujita | G11B 5/102 |
| | | | 369/13.13 |
| 8,721,902 B1 * | 5/2014 | Wang | G11B 5/6088 |
| | | | 360/59 |
| 8,865,489 B2 | 10/2014 | Rogers et al. | |
| 8,995,088 B1 * | 3/2015 | Boone | G11B 5/3136 |
| | | | 360/125.32 |
| 9,105,286 B2 | 8/2015 | Boone, Jr. | |
| 9,576,595 B1 | 2/2017 | Hipwell, Jr. et al. | |
| 9,620,151 B1 * | 4/2017 | Shimazawa | G11B 5/314 |
| 10,069,029 B1 | 9/2018 | Olson et al. | |
| 10,466,572 B2 | 11/2019 | Hurwitz | |
| 10,984,821 B1 | 4/2021 | Gubbins et al. | |
| 11,164,600 B1 * | 11/2021 | Zhao | G11B 5/147 |
| 11,189,312 B1 * | 11/2021 | Huang | G11B 5/255 |
| 2002/0058162 A1 * | 5/2002 | Shibata | C30B 25/02 |
| | | | 257/E21.127 |
| 2002/0196584 A1 * | 12/2002 | Katase | G11B 5/4853 |
| 2003/0162041 A1 | 8/2003 | Nemoto et al. | |
| 2003/0211369 A1 | 11/2003 | Riman et al. | |
| 2007/0215480 A1 | 9/2007 | Fang et al. | |
| 2008/0299679 A1 | 12/2008 | Zhao et al. | |
| 2009/0199960 A1 * | 8/2009 | Nuzzo | H01L 31/18 |
| | | | 156/230 |
| 2009/0217517 A1 | 9/2009 | Pique et al. | |
| 2010/0080895 A1 | 4/2010 | Shukla et al. | |
| 2010/0283069 A1 | 11/2010 | Rogers et al. | |
| 2010/0323100 A1 * | 12/2010 | Sapozhnikov | G11B 5/3196 |
| | | | 427/97.1 |
| 2011/0018158 A1 | 1/2011 | Menard | |
| 2011/0028236 A1 | 2/2011 | Takechi et al. | |
| 2011/0038236 A1 | 2/2011 | Mizuno et al. | |
| 2011/0138600 A1 | 6/2011 | Oggioni et al. | |
| 2011/0216635 A1 | 9/2011 | Matsumoto | |
| 2012/0084969 A1 * | 4/2012 | Tanaka | G11B 5/6088 |
| | | | 29/603.01 |
| 2012/0147718 A1 | 6/2012 | Hellwig et al. | |
| 2013/0230071 A1 | 9/2013 | Haensel et al. | |
| 2013/0286799 A1 | 10/2013 | Zhu et al. | |
| 2013/0316487 A1 | 11/2013 | Graff et al. | |
| 2013/0330853 A1 | 12/2013 | Tischler | |
| 2014/0241137 A1 | 8/2014 | Jin et al. | |
| 2014/0373898 A1 | 12/2014 | Rogers et al. | |
| 2015/0036468 A1 | 2/2015 | Boone, Jr. | |
| 2015/0179204 A1 | 6/2015 | Mosendz et al. | |
| 2016/0118071 A1 * | 4/2016 | Hirotsune | G11B 5/3133 |
| | | | 360/75 |
| 2016/0195676 A1 | 7/2016 | Yu et al. | |

OTHER PUBLICATIONS

Stadler et al., "Integrated Magneto-Optical Materials and Isolators—A Review", IEEE Photonics Journal, 2013, 16 pages.

* cited by examiner

SINGLE-GRAIN NEAR-FIELD TRANSDUCER AND PROCESS FOR FORMING SAME

RELATED PATENT DOCUMENTS

This application is a divisional of U.S. application Ser. No. 16/252,167, filed Jan. 18, 2019, which claims the benefit of U.S. Provisional Application No. 62/619,368 filed on Jan. 19, 2018, the content of which are all incorporated by reference in their entireties.

SUMMARY

Embodiments of the disclosure are generally directed to a method comprising forming, on a carrier wafer, a film that cannot be formed or deposited directly on a target wafer. The film formed on the carrier wafer can be any film of material or materials. Representative films include, but are not limited to, single-crystal-like films. The method also comprises transferring the film formed on the carrier wafer to the target substrate. According to embodiments of the disclosure, process limitations (e.g., thermal budget, available crystalline template, etc.) can be reduced by processing a desired film on a carrier wafer first before transferring it to the target substrate.

Various embodiments are directed to methods involving the transfer of the film from the carrier wafer to the target substrate. According to some embodiments, transferring the film from the carrier wafer to the target substrate involves wafer bonding. Representative wafer bonding embodiments involve flipping the carrier wafer and bonding the film on the carrier wafer to the target substrate, followed by removal of the carrier wafer.

In some embodiments, wafer bonding is performed without addition of any bonding material. In other embodiments, wafer bonding is performed with one or more bonding materials, which can be an oxide and/or a metal from materials already present on one or both of the carrier wafer and the target substrate. In further embodiments, wafer bonding is performed with the addition of one or more foreign bonding materials (e.g., material or materials different from the native material or materials on the carrier wafer and/or the target substrate).

According to further embodiments, transferring the film from the carrier wafer to the target substrate involves transfer printing. Representative transfer printing embodiments involve picking up a small piece of the film from the carrier wafer and printing it on the target substrate.

Embodiments of the disclosure are directed to a method comprising forming a single-crystal-like metal layer on a metal seed layer, the metal seed layer formed on a carrier wafer. The method comprises forming a first diffusion layer on the single-crystal-like metal layer. The method also comprises forming a second diffusion layer on a dielectric layer of a target substrate, the target substrate comprising one or more recording head subassemblies. The method further comprises flipping and joining the carrier wafer with the target substrate such that the first and second diffusion layers are bonded and the single-crystal-like metal layer is integrated with the recording head as a near-field transducer.

Embodiments of the disclosure are directed to a method comprising forming a single-crystal-like metal layer on a metal seed layer, the metal seed layer formed on a carrier wafer. The method comprises forming a first dielectric bonding layer on the single-crystal-like metal layer. The method also comprises forming a second dielectric bonding layer on a dielectric layer of a target substrate, the target substrate comprising one or more recording head subassemblies. The method further comprises activating mating surfaces of the first and second dielectric bonding layers. The method also comprises flipping and joining the carrier wafer with the target substrate such that the first and second dielectric bonding layers are bonded and the single-crystal-like metal layer is integrated with the recording head as a near-field transducer.

Embodiments of the disclosure are directed to a method comprising forming a single-crystal-like metal layer on a metal seed layer, the metal seed layer formed on a sacrificial wafer. The method comprises forming an anchor layer on the single-crystal-like metal layer, and separating the single-crystal-like metal layer from the sacrificial wafer via the anchor layer. The method also comprises transporting, via the anchor layer, the near-field transducers to a target substrate comprising one or more recording head subassemblies. The method further comprises joining the single-crystal-like metal layer with the recording head, the single-crystal-like metal layer being integrated with the recording head as a near-field transducer.

Embodiments are directed to a method comprising forming a single-crystal-like metal layer on a metal seed layer, the metal seed layer formed on a carrier wafer. The surface of the single-crystal-like metal layer defines a first metal bonding layer. The method comprises providing a second metal bonding layer on the target substrate, the target substrate comprising one or more recording head subassemblies. The method also comprises activating mating surfaces of the first and second metal bonding layers. The method further comprises flipping and joining the carrier wafer with the target substrate such that the first and second metal bonding layers are bonded and the single-crystal-like metal layer is integrated with the recording head as a near-field transducer.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

The present disclosure is generally related to heat-assisted magnetic recording (HAMR), also referred to as energy-assisted magnetic recording (EAMR), thermally-assisted recording (TAR), thermally-assisted magnetic recording (TAMR), etc. In a HAMR device, a near-field transducer (NFT) concentrates optical energy into a tiny optical spot in a recording layer, which raises the media temperature locally, reducing the writing magnetic field required for high-density recording. A waveguide delivers light to the near-field transducer and excites the near-field transducer.

The activation of a near-field transducer utilizes the excitation of local surface-plasmons at the interface between a plasmonic metal of free electrons and a dielectric material. On resonance, the optical energy from a light delivery dielectric waveguide can be concentrated into a local volume. Field-line concentration occurs at a local shape singularity, such as a gap or a tip, due to the collective oscillations of electrons in the metal, which increases the interaction between light and matter peg coupler.

One major obstacle that prevents practical applications of such an NFT is reliability. A near-field transducer that interacts with light to generate a confined hot spot in a recording media also absorbs light, resulting in temperature rise of the NFT. This temperature rise degrades the NFT performance.

One way to combat this type of failure is to use a mechanically robust plasmonic material of high melting temperature, such as Rh, Ir, and Pt, as the peg layer. Unfortunately, these materials are usually of high plasmonic loss and low thermal conductivity. Moreover, to obtain high thermal gradient (>10 K/nm), thermal background (from far-field excitation light and near-field light of the NFT except for the peg) is removed and only the near field from the peg will heat a recording media. This results in large temperature rise (for instance, >400° C.), causing head failure from, for example, peg deformation, peg oxidation, material separation, head overcoat removal, and dielectric material recess and corrosion.

Figure 1:
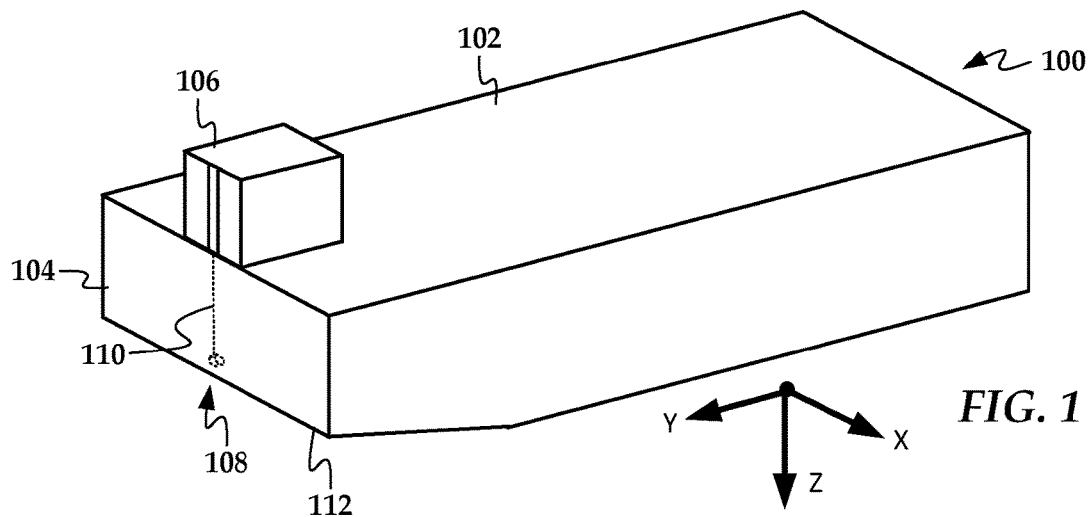
FIG. 1 is a perspective view of a slider assembly according to an example embodiment.

In reference now to FIG. 1, a perspective view shows a read/write head 100 according to an example embodiment. The read/write head 100 may be used in a magnetic data storage device, e.g., HAMR hard disk drive. The read/write head 100 may also be referred to herein interchangeably as a slider, head, write head, read head, recording head, etc. The read/write head 100 has a slider body 102 with read/write transducers 108 at a trailing edge 104 that are held proximate to a surface of a magnetic recording medium (not shown), e.g., a magnetic disk.

The illustrated read/write head 100 is configured as a HAMR device, and so includes additional components that form a hot spot on the recording medium near the read/write transducers 108. These HAMR components include an energy source 106 (e.g., laser diode) and a waveguide 110. The waveguide 110 delivers electromagnetic energy from the energy source 106 to a near-field transducer (NFT) that is part of the read/write transducers 108. The NFT achieves surface plasmon resonance and directs the energy out of a media-facing surface 112 to create a small hot spot in the recording medium.

Figure 2:
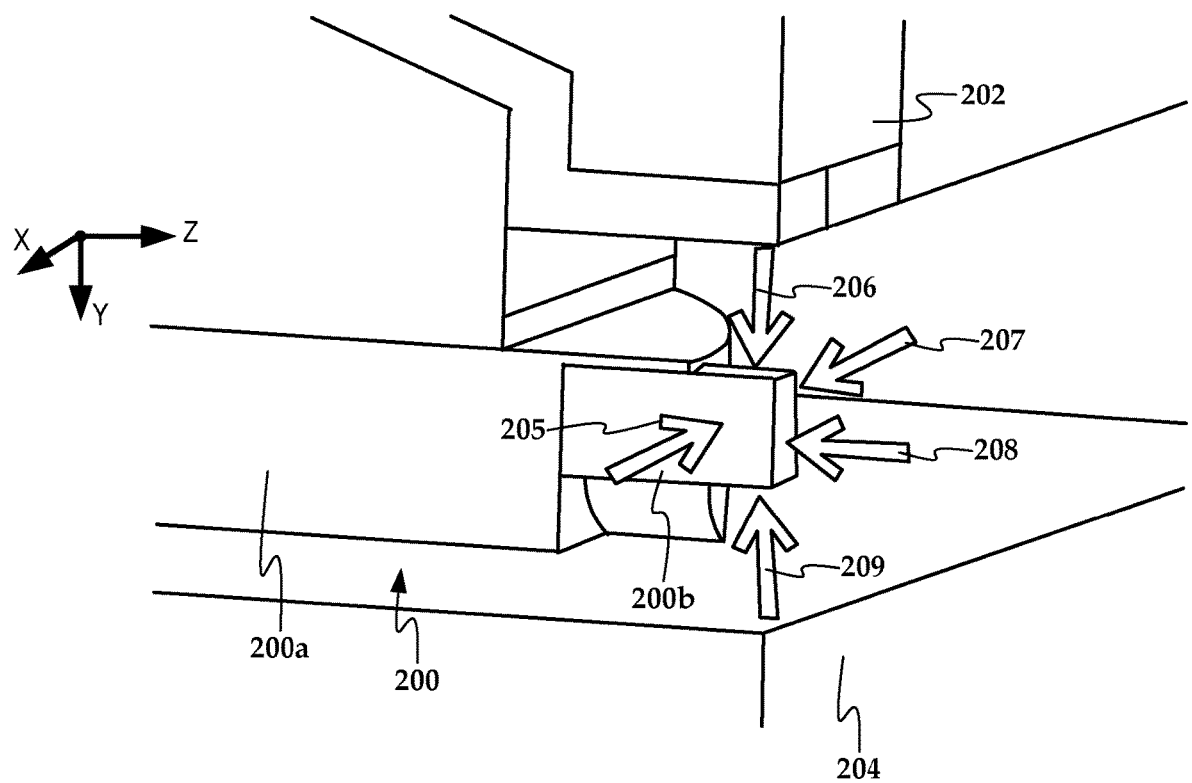
FIG. 2 is a perspective view of a near-field transducer and write pole according to according to an example embodiment.

There are at least two general types of near-field transducers, one type using a sub-wavelength metallic aperture (for instance, C-aperture, plasmonic gap waveguide) and the other one uses an optical antenna with an extended or protruded tip (peg). An example of the latter is shown in FIG. 2, which is a perspective view of a near-field transducer 200 according to an example embodiment. The near-field transducer 200 is near a write pole 202 that are both proximate a media-facing surface 204 (e.g., air-bearing surface or ABS) that faces a magnetic recording medium (not shown). The near-field transducer 200 has an enlarged part 200a and peg 200b, although the embodiments described below may also include peg-only embodiments, and/or aperture embodiments.

This disclosure relates to a single-grain near-field transducer (NFT) with orientation control using epitaxial film growth and transfer. As seen in FIG. 2, the enlarged part 200a gathers surface plasmons which are directed to the peg 200b, which shapes and directs the surface plasmons to the recording medium. In order to increase life of the NFT, a mechanically robust platinum-group metal may be used for NFT pegs in HAMR heads. Some platinum-group metals can undergo degradation during operation which can limit for head lifetimes. Main failure modes observed in pegs formed from some platinum-group metals are grain growth, internal void formation, and oxidation.

These phenomena are facilitated by a film microstructure that is polycrystalline with nanoscale grains, a large grain size distribution (with main grain size on or below the order of the peg height and width—~45 nm) and many open high-angle grain boundaries. This grain boundary structure facilitates diffusional grain growth/reorientation processes under heat load as well as allowing penetration of oxygen and water vapor from the ABS into the peg. The grain structure is uncontrolled during film deposition and has large part-to-part variation which is believed to contribute to the current wide spread in head lifetimes.

Grain boundary defectivity also reduces two key peg properties below bulk levels: thermal conductivity (TC), which increases heating in the NFT and accelerates failure mode processes, and plasmon propagation length, which reduces NFT efficiency. It is desirable to eliminate grain boundaries from the peg to increase TC (which will help reduce NFT temperature), remove pathways for penetration of other species into the peg (oxidizers, seed layers, diffusion barriers, etc.), remove internal sites for inter-grain voiding, and enable optimization of NFT performance/reliability by peg crystalline orientation control (e.g., at the ABS face).

Material benefits of single-grain pegs include: increased thermal conductivity (lower temperature) due to reduced diffuse (lossy) scattering from conduction electrons at grain boundaries; increased surface plasmon decay length (resulting in higher NFT efficiency); and elimination of initiation points for through-thickness oxidation in oxidation-prone films. Control of the crystal lattice orientation in a single-grain peg relative to the ABS may offer some unique benefits. For example, surface energies of the various crystal faces or peg metals do have sufficient enough differences that certain peg orientations may be more thermodynamically stable and minimize the tendency to reorient.

Oxidation in many metals is known to be orientation-dependent. For face-centered cubic (fcc) metals, oxidation rates are lowest for surfaces with high surface density e.g., (111)<(100)<110). This might be exploited to retard the degradation rate of the peg. The ABS topography may be improved by particular orientations of peg crystal orientations. For example, fcc metals show large anisotropy in ion-bombardment etch rates. This may be exploited to reduce trailing edge topography and improve head overcoat uniformity/continuity over peg and surrounding materials. Examples of particular peg orientations that may improve reliability in a recording head are shown in U.S. patent application Ser. 16/196,228, filed Dec. 13, 2018, which is hereby incorporated by reference in its entirety.

Prior solutions proposed to produce single-grain pegs include very high deposition thermal budgets to promote large grains during film growth or post-deposition laser annealing. Both are limited due to thermal damage risk to the reader, stress cracking from rapid cooldown, and absence of orientation control. An alternate process for generating single-crystal-like peg films on AlTiC wafers, preferably with orientation control, is described herein. Note that the structures and processes described herein may be applicable to other NFT configuration, e.g., elongated peg with no enlarged portion, plates with a gap therebetween, aperture, etc. Generally, the processes may be used to form portions of the NFT that are located near the ABS or in other regions that may impact reliability.

Figure 3:
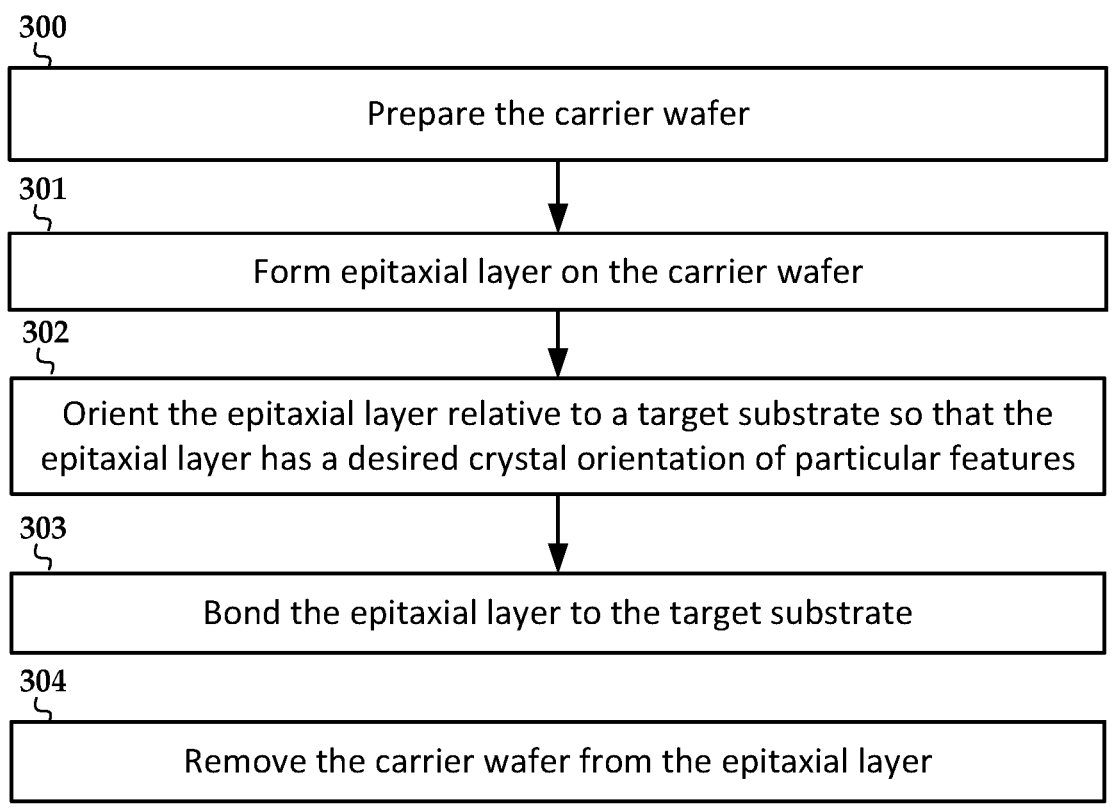
FIG. 3 is a flowchart showing a process according to an example embodiment.

One solution proposed herein is to fabricate an epitaxial peg film on a separate carrier wafer and then transfer it to the recording head device wafer (referred to herein as "target substrate") via wafer bonding and carrier wafer removal. In FIG. 3, a flowchart shows a high-level view of such a process according to an example embodiment. The process involves preparing 300 a carrier wafer. One or more epitaxial layers are then formed 301 on the carrier wafer, e.g., via layer deposition at a high temperature.

The epitaxial layer (or portions thereof) is orientated relative to a target substrate to form components with a desired crystal orientation relative to the target substrate. For example, as relates to forming a peg 200b shown in FIG. 2, the orientation may be defined such that some or all of surfaces 205-209 have a particular crystal orientation. The epitaxial layer is bonded 303 to the target substrate and the carrier wafer is removed 304 from the epitaxial layer. As will be described below, the removal 304 of the carrier wafer from the epitaxial layer in some embodiments may occur earlier than shown here, e.g., before orientation 302 or bonding 303.

Epitaxial films are single-crystal-like with either no grain boundaries or coherent boundaries only (e.g., twin boundaries). By separating the processing of the peg film from the device wafer, thermal budget or other processing constraints are removed and higher quality films can be realized. Crystal structure and out-of-plane orientation of the epitaxial layer can be defined through selections of deposition process parameters on the carrier wafer, e.g., substrate material, structure, orientation, wafer temperature, etc. During the transfer process the carrier wafer can be rotated relative to the target substrate prior to bonding to provide in-plane orientation control of the peg film relative to the ABS.

A manufacturing process that implements this solution can utilize a film deposition technique capable of ~50 nm-thick single-crystal-like growth of a platinum-group metal (e.g., Rh, Pd, Ir, Pt), Au, Ag, Cu, Al, or an alloy including one or more of any of these metals. A technique compatible with existing wafer fab equipment is preferred. One technique that can accomplish this is metal-metal epitaxy on silicon (MMES) using epitaxial Cu seed layer.

For bonding of single-crystal-like layers from carrier wafer to target substrate, one technique that may be used is bonding between AlTiC wafer and carrier wafer (e.g., direct bonding without adhesion layer, indirect bonding with adhesion layer, transfer printing of small islands). To remove the carrier wafer, hot KOH wet etching of Si or layer exfoliation from engineered carrier wafer may be used.

Epitaxial film growth may use single-crystal-like film deposition, e.g., Metal-Metal Epitaxy(MMES) on an Si substrate. Si has good lattice match with most fcc metals, with multiple possible epitaxial orientation relationships, e.g., $[110]_{Si} \| [100]_{fcc}$; ($d_{Si(110)} \approx d_{fcc(100)}$) and $[100]_{Si} \| [110]_{fcc}$; ($d_{Si(100)} \approx 2d_{fcc(110)}$). Surface cleaning of the Si substrate may be used to remove Si oxide. This may involve HF treatment and in situ Ar mill or etch. A buffer layer with lower melting might be used to improve mobility for better growth. For example, Cu has been used as a buffer layer for epitaxy on Si, MgO, NaCl. Benefits over other means of epitaxial film growth include room temperature processing and low cost. Examples of successful MMES with a Cu buffer layer include Rh, Ir, Pd, Al, Fe, Ni, Au, Mo, W, Nb, Pt, Zr, and Hf.

In order to perform single-crystal-like layer transfer, two approaches may be used. One is wafer bonding. In such a case, the carrier wafer is flipped, facing the target substrate. The carrier wafer and target substrate are brought into contact, and surface layers from both wafers are bonded together. Another approach is transfer printing, representative examples of which are disclosed in commonly-owned U.S. Pat. Nos. 10,069,029 and 9,576,595, both of which are incorporated herein by reference. A single-crystal-like layer can be patterned into islands on a carrier wafer, the islands having a target shape. The target shape can define the shape of an NFT part or a shape larger than the NFT part shape. For example, according to one transfer printing approach, a transfer printed piece of the epitaxial film having a target shape larger than the NFT part shape can be patterned post-transfer. A sacrificial release layer underneath the single-crystal-like layer is removed. Single-crystal-like layer islands are then picked up from carrier wafer (e.g., via a stamp-like carrier), and placed onto the target substrate.

Possible bonding techniques include direct bonding without adhesion layer. This may use hydrophilic surface bonding, which in one example involves hydrophilic surface creation on oxides ($O_2$ plasma, etc.). This works for oxide-oxide interfaces. Hydrophobic surface bonding may instead involve hydrophobic surface creation using $N_2$ plasma, HF dip, etc. This works for oxide-oxide and nitride-nitride interfaces. Direct bonding may also include surface activated bonding (SAB). In such a technique, metal and oxide surfaces are activated through removal of surface contamination using Ar, $O_2$, $N_2$, Ne, Xe, He, Kr plasma or ion beam, etc. This works for metal-metal, metal-oxide, and oxide-oxide interfaces. Another option is eutectic bonding, which uses an intermediate metal layer that can produce a eutectic system.

Other bonding techniques include indirect bonding with adhesion layer. For example, atomic diffusion bonding (ADB) involves deposition of an ultrathin (<1 nm) diffusion layer on both carrier and target substrates. The diffusion materials may include Ti, Al, Au, Ag, Cu, Pt, Cr, Ta, W, etc. Bonds are formed through atomic diffusion. This works for metal-metal, metal-oxide, and oxide-oxide interfaces. An example embodiment using metal-to-oxide ADB wafer bonding is shown in the block diagram of FIG. 4. A carrier wafer 402 has a single-crystal-like epilayer 402c built on a Cu buffer layer 402b and a Si substrate 402a. of NFT material. A target substrate has an AlO CNS (core-to-NFT spacer) layer 404b on an AlTiC substrate 404a. Diffusion layers 402d, 404c are respectively deposited on wafers 402, 404, and the carrier wafer 402 is flipped and attached to the target substrate 404 such that the diffusion layers are joined as shown in the right hand side of FIG. 5.

Figure 5:
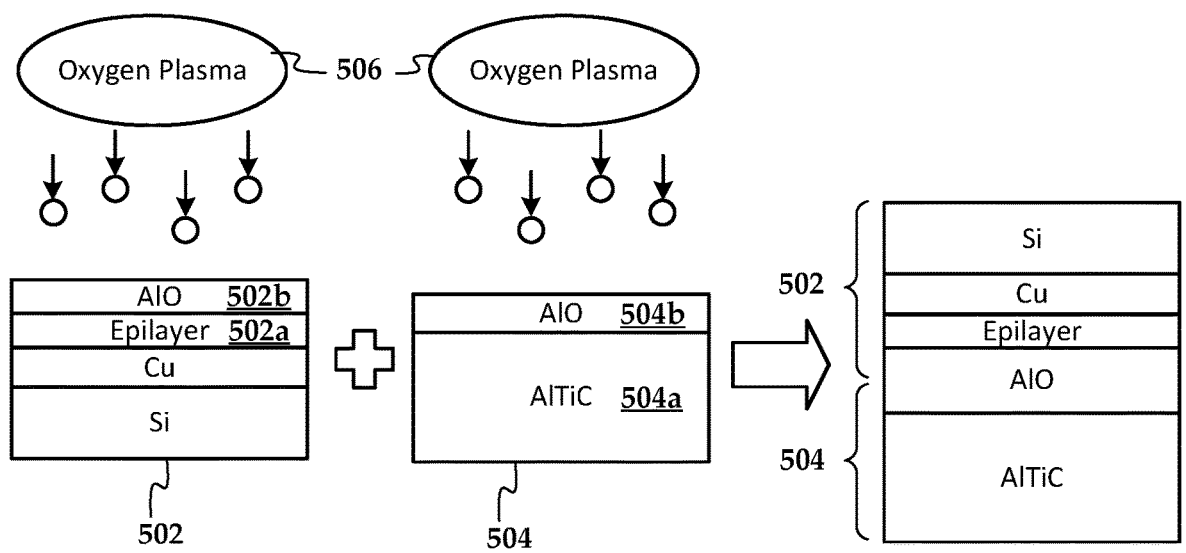
Figure 6:
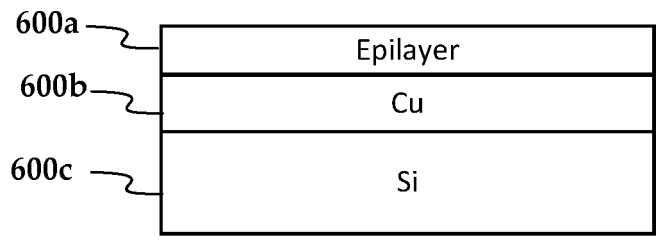
Figure 7:
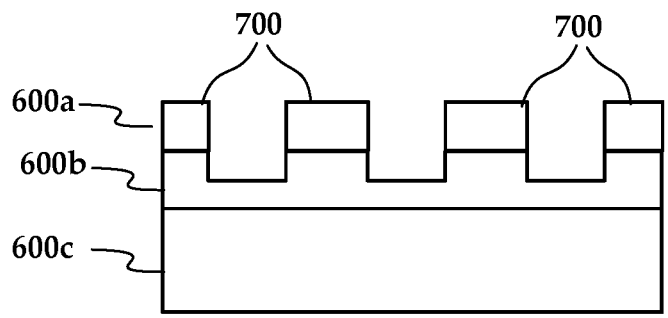

In FIG. 5, a diagram shows an oxide (CNS)-to-oxide (CNS) interface used for SAB of wafers according to another example embodiment. The carrier wafer 502 includes a single-crystal-like NFT layer 502a covered under a thin atomic layer deposition (ALD) AlO layer 502b. The target substrate 504 includes an ALD AlO CNS layer 504b and an AlTiC substrate 504a. Both ALD layers 502b, 504b are treated with oxygen plasma 506 before flipping the carrier wafer 502 and bonding to the target layer 504 as seen in the right hand side of FIG. 5. In some embodiments, the oxide-to-oxide interface can include SiO2 layers.

Note that the epilayers 402c, 502c can be patterned into the target shape during any step before flipping and bonding on the carrier wafer or after bonding on the target substrate. This may include photoresist etching NFT shapes (and/or other component shapes) into the epilayers 402c, 502c with a desired crystal orientation relative to head features. For example, a crystal orientation of an ABS facing edge of the shape may have a high atomic packing factor to increase durability of this edge. Other sides of the shape, e.g., crosstrack or downtrack sides, may also have predetermined orientations. The wafers 402, 404, 502, 504 are oriented relative to one another to maintain this predetermined orientation relative to head features. During and/or after bonding, heat treatment and/or applying of pressure might be used to facilitate bonding.

Figure 8:
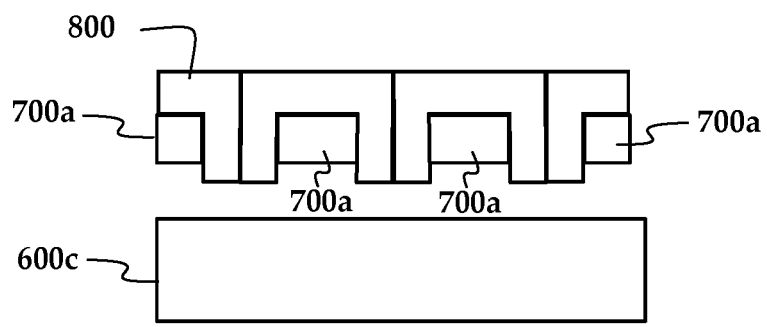

In FIGS. 6-9, diagrams show a single-crystal-like layer transfer print according to an example embodiment. A single-crystal-like epilayer 600a over Cu 600b on a Si wafer 600c serves as metal epitaxy template as well as sacrificial release layer of a sacrificial wafer. As seen in FIG. 8, the single-crystal-like metal layers 600a-b are patterned into intermediate patterns, e.g., a component such as an NFT peg with features sizes on the order of μm. These patterns result in islands 700 of the epitaxial material 600a supported by the Cu 600b. As seen in FIG. 8, an anchor layer 800 is coated over the islands 700 to secure the islands. The Cu release layer 600b is chemically removed leaving single-crystal-like components 700a held together by the anchor layer 800.

Figure 4:
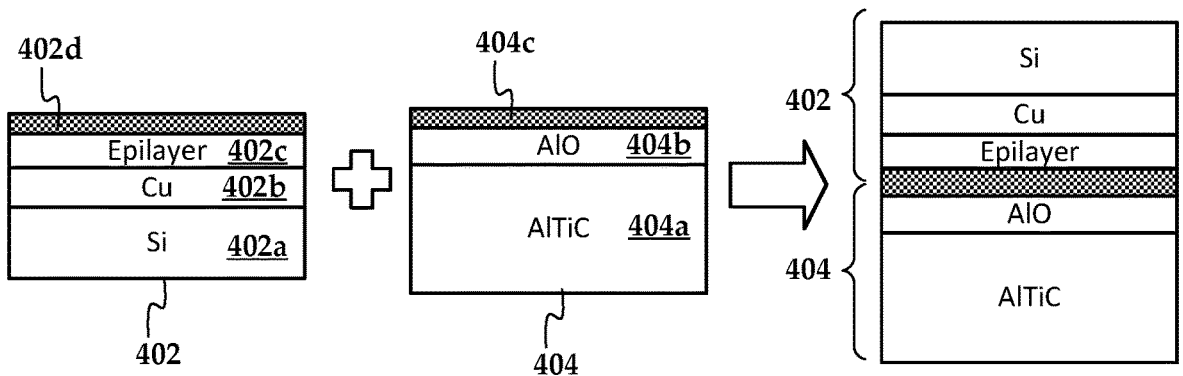
FIGS. 4, 5, 6, 7, 8, and 9 are diagrams showing manufacturing of a single-crystal-like component according to example embodiments.
Figure 9:
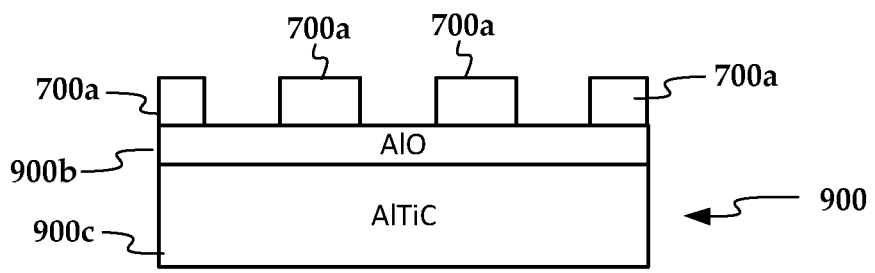

The single-crystal-like components 700a are protected by the anchor layer 800 during removal of the Cu layer 600b. The anchor layer 800 can also be used to pick up single-crystal-like components 700a and 'print' the components 700a onto a target substrate 900 as seen in FIG. 9. The target substrate 900 in this example includes an AlO layer 900b on an AlTiC substrate 900c. The bonding between the AlO layer 900b and the islands 900a may be affected using a diffusion layer or activated dielectric layers as shown in FIGS. 4 and 5. Additional operations may be performed on the components 700a after being bonded to the target substrate 900. For example, the components 700a may be etched or milled to a desired final shape and/or thickness. Planarization may also be used to finalize a thickness of the components 700a.

Figure 10:
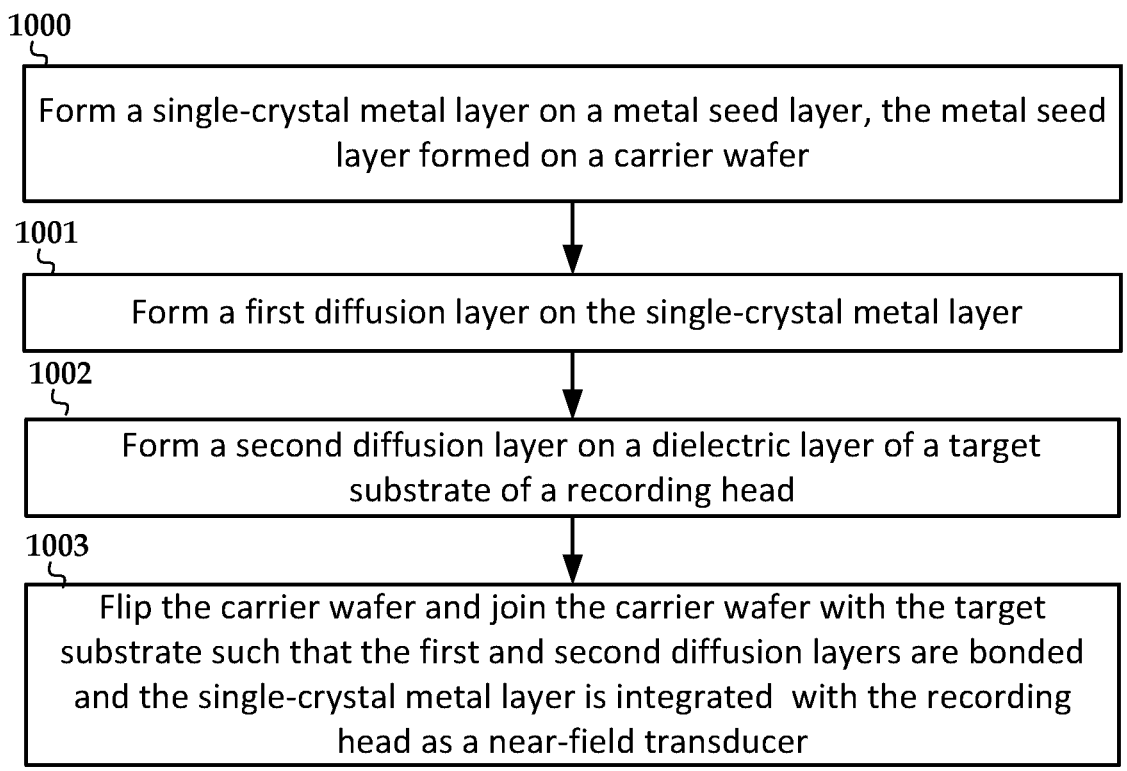
FIGS. 10, 11, 12, and 13 are flowcharts of methods according to example embodiments.

In FIG. 10, a flowchart shows a method according to an example embodiment. The method involves forming 1000 a single-crystal-like metal layer in the shape of a near-field transduce on a metal seed layer, the metal seed layer formed on a first substrate of a carrier wafer. A first diffusion layer is formed 1001 on the single-crystal-like metal layer and a second diffusion layer is formed 1002 on a dielectric layer of a target substrate of a recording head. The carrier wafer is flipped and joined 1003 with the target substrate such that the first and second diffusion layers are bonded and the near-field transducer is integrated with the recording head.

Figure 11:
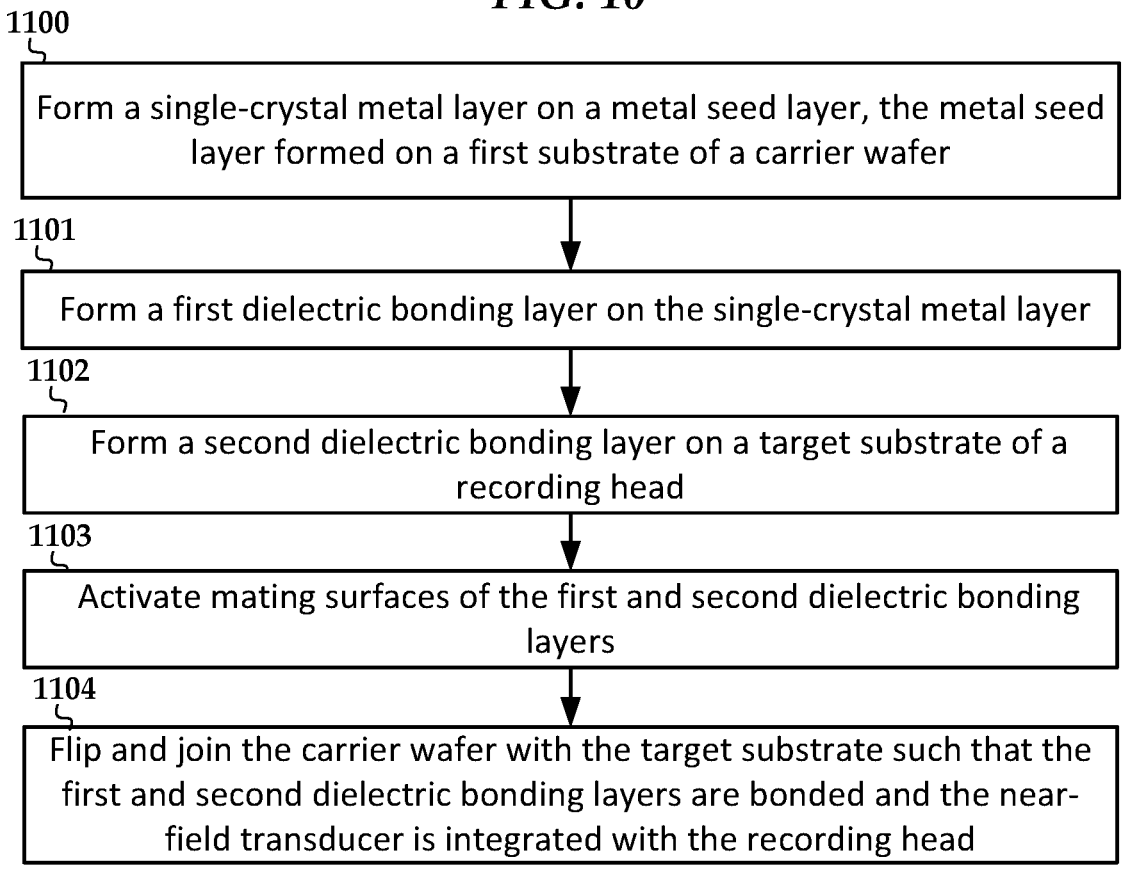

In FIG. 11, a flowchart shows a method according to another example embodiment. The method involves forming 1100 a single-crystal-like metal layer in the shape of a near-field transducer on a metal seed layer, the metal seed layer formed on a first substrate of a carrier wafer. A first dielectric bonding layer is formed 1101 on the single-crystal-like metal layer and a second dielectric bonding layer is formed 1102 on a target substrate of a recording head. Mating surfaces of the first and second dielectric bonding layers are activated 1103 (e.g., using plasma or ion beam of Ar, $O_2$, $N_2$, Ne, Xe, He, Kr etc.). The carrier wafer is flipped and joined 1104 with the target substrate such that the first and second dielectric bonding layers are bonded and the near-field transducer is integrated with the recording head.

Figure 12:
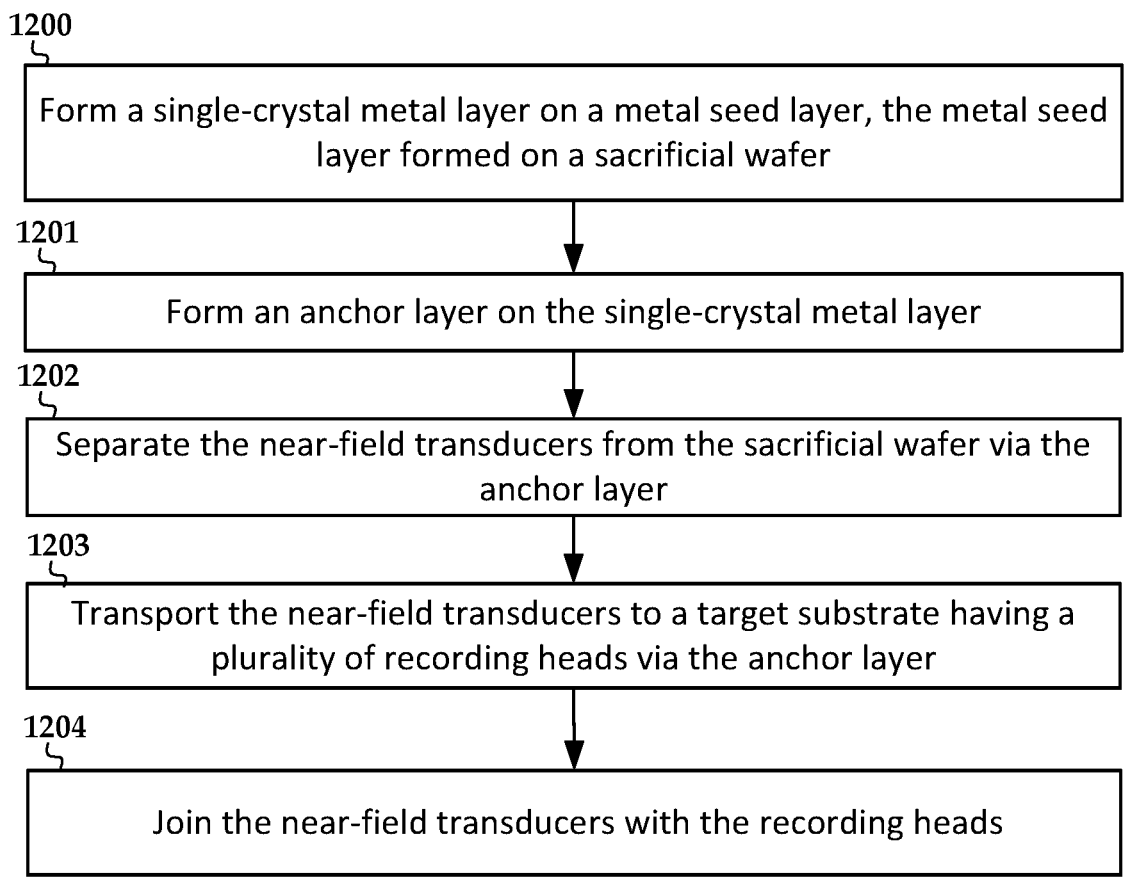

In FIG. 12, a flowchart shows a method according to another example embodiment. The method involves forming 1200 a single-crystal-like metal layer in the shape of near-field transducers on a metal seed layer, the metal seed layer formed on a sacrificial wafer. An anchor layer is formed 1201 on the single-crystal-like metal layer and used to separate 1202 the near-field transducers from the sacrificial wafer. The anchor layer is used to transport 1203 the near-field transducers to a target substrate having a plurality of recording heads. The near-field transducers are joined 1204 with the recording heads.

Figure 13:
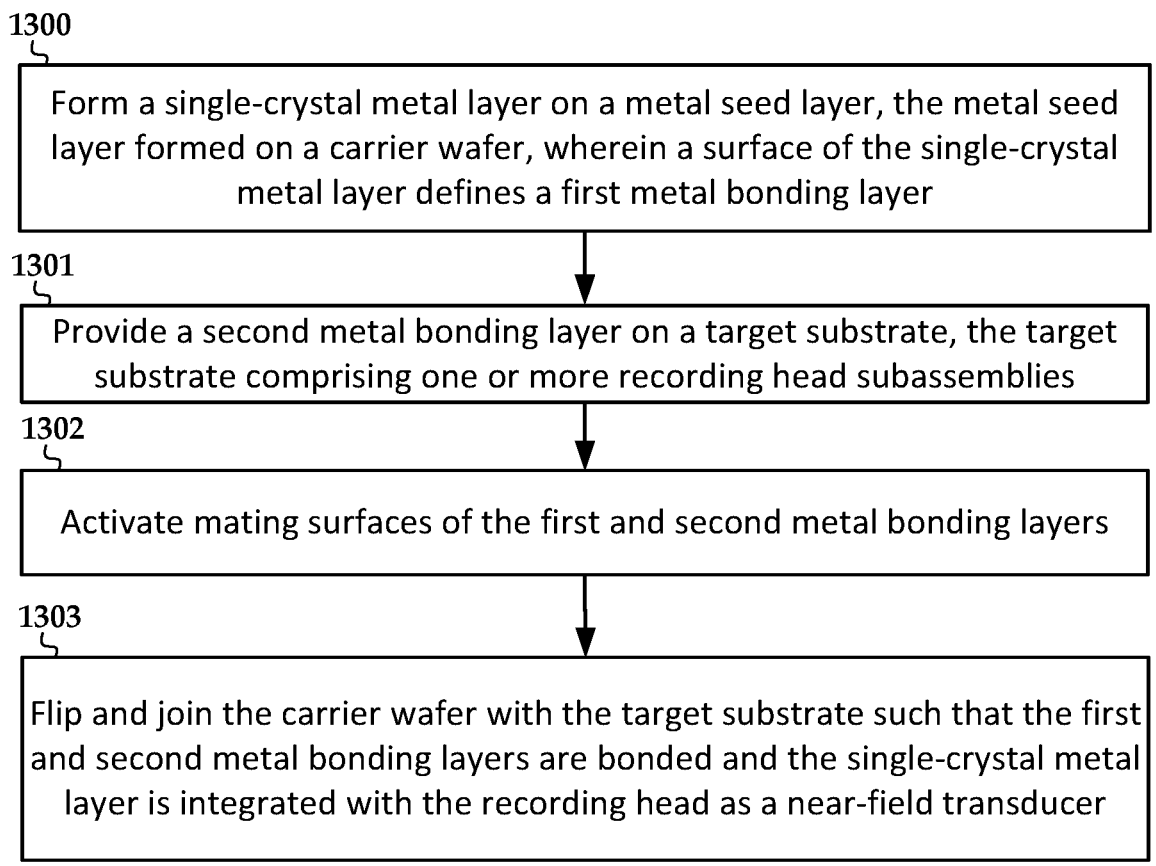

In FIG. 13, a flowchart shows a method according to another example embodiment. The method shown in FIG. 13 is directed to forming a direct metal-metal bond without a diffusion layer in between. The method involves forming 1300 a single-crystal-like metal layer on a metal seed layer, the metal seed layer formed on a carrier wafer. A surface of the single-crystal-like metal layer defines a first metal bonding layer. A second metal bonding layer is provided 1301 on a target substrate, the target substrate comprising one or more recording head subassemblies. In some embodiments, the second metal bonding layer is formed on the target substrate. In other embodiments, the native metal on the target substrate surface serves as the second metal bonding layer. The second metal bonding layer can comprise a platinum-group metal (e.g., Rh, Pd, Ir, Pt), Au, Ag, Cu, Al, or an alloy including one or more of any of these metals. The composition of the second metal bonding layer can be the same as, or different from, the composition of the first metal bonding layer.

Mating surfaces of the first and second metal bonding layers are activated 1302 (e.g., using plasma or ion beam of Ar, $O_2$, $N_2$, Ne, Xe, He, Kr etc.). The carrier wafer is flipped and joined 1303 with the target substrate such that the first and second metal bonding layers are bonded and the single-crystal-like metal layer is integrated with the recording head as a near-field transducer.

Various methods of bonding a carrier wafer comprising a single-crystal-like metal layer to a target substrate comprising one or more recording head subassemblies are disclosed herein. Non-limiting examples of representative bonding methods are summarized as follows. A first example bonding method involves metal-metal bonding wherein an element to promote diffusion bonding is added at one or both bonding surfaces of the carrier wafer and target substrate. This bonding method involves adding a foreign diffusion material at the bonding interface. For example, a layer of foreign diffusion material can be added to one or both bonding surfaces of the carrier wafer and target substrate. The foreign diffusion material can be added to any kind of surface on the carrier wafer and/or the target substrate, with the surface being a single metal layer, multiple metal layers, a single oxide layer, multiple oxide layers, or a mix of any of these layers.

A second example bonding method involves metal-metal bonding where the native metal on at least one portion of the carrier wafer surface or the native metal on at least one portion of the target substrate surface is added to one or both bonding surfaces of the carrier wafer and target substrate. For example, multiple metal patterns and/or multiple oxide patterns may be present on the surface of the carrier wafer or the target substrate. One of the materials of these patterns can be used as a diffusion material. This bonding method involves adding a layer using one of the native metals that already exist on the carrier wafer and/or the target substrate. For example, a native metal layer can be added to one or both bonding surfaces of the carrier wafer and target substrate. In some embodiments, a foreign diffusion material can be added to any kind of surface on the carrier wafer and/or the target substrate, with the surface being a single metal layer, multiple metal layers, a single oxide layer, multiple oxide layers, or a mix of any of these layers.

A third example bonding method involves metal-metal bonding wherein no additional metal is added to one or both bonding surfaces of the carrier wafer and target substrate. This bonding method involves bonding the carrier wafer and target substrate without adding additional metal at the bonding interface. In some embodiments, the metal layer for bonding is provided on the carrier wafer. In other embodiments, the metal layer for bonding is provided on the target substrate, which can comprise a metal, an oxide or a mix of metal and oxide. Bonding can occur on different metal patterns with the same or different materials on the same surface of the carrier wafer and/or target substrate.

A fourth example bonding method involves oxide-oxide or metal-oxide bonding wherein oxide is added to one or both bonding surfaces of the carrier wafer and target substrate to promote bonding. For example, an oxide layer can be added to one or both bonding surfaces of the carrier wafer and target substrate. In some embodiments, a foreign diffusion material can be added to any kind of surface on the carrier wafer and/or the target substrate, with the surface being a single metal layer, multiple metal layers, a single oxide layer, multiple oxide layers, or a mix of any of these layers.

It is understood that the four example bonding methods discussed above can include additional processing steps described hereinabove. For example, any of the four example bonding methods can include surface activation of the bonding surfaces, such as by using plasma or ion beam of Ar, O2, N2, Ne, Xe, He, Kr etc. Also, a diffusion layer added to the carrier wafer and the target substrate can comprise the same or different materials. Further, representative embodiments can include any combination of the processes of the example bonding methods, and can further include adding a diffusion layer and/or surface activation with plasma or ion beam.

Various embodiments of a single-crystal-like metal layer and a target substrate are described herein as comprising a metal or metal layer. It is understood that the single-crystal-like metal layer and/or the target substrate can comprise mixed materials (e.g., a combination of a metal and one or more other materials, such as a metal and a dielectric on surface).

It is also understood that the term single-crystal-like metal layer broadly encompasses any epitaxial metal layer in any orientation. The term single-crystal-like metal layer includes any epitaxial metal layer comprising rotationally-twinned domains with special boundaries between them. For example, the term single-crystal-like metal layer includes fcc(111)-oriented films and hcp(0001)-oriented films which are comprised of populations of rotationally-twinned domains with special boundaries between them.

The example bonding methods disclosed above can be applied to transfer any film of interest from a carrier wafer. The film of interest can be of any material, e.g., metal, alloy, dielectric, etc. and it is not necessarily an epitaxial film. The film of interest can be produced for the need of certain processes, which cannot be achieved on a target substrate. It is understood that the mating layers on the carrier wafer and the target substrate can the same or different materials.

Other substrates (other than Si substrates) can also be used for the carrier wafer. Substrates known to be good epitaxial templates include, but are not limited to, those comprising sapphire, NaCl, MgO, SrTiO3, and Yttrium stabilized zirconia.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A method comprising:
   forming a metal layer on a metal seed layer, the metal layer comprising a platinum group metal and having a structure with either no grain boundaries or coherent grain boundaries only, the metal seed layer formed on a carrier wafer, wherein the metal layer is formed with a predetermined crystalline orientation relative to the carrier wafer;
   forming a first bonding layer on the metal layer;
   forming a second bonding layer on a dielectric layer of a target substrate, the target substrate comprising one or more recording head subassemblies; and
   flipping and joining the carrier wafer with the target substrate such that the first and second bonding layers are bonded and the metal layer is integrated with the recording head as a near-field transducer, wherein joining the carrier wafer with the target substrate comprises rotating the carrier wafer relative to the target substrate to provide in-plane orientation control of the near-field transducer relative to an air-bearing surface of the recording head.

2. The method of claim 1, further comprising patterning the metal layer into a target shape before flipping and joining the carrier wafer with the target substrate, the target shape defining a shape of the near-field transducer or a shape larger than the near-field transducer shape.

3. The method of claim 1, further comprising patterning the metal layer into a target shape after flipping and joining the carrier wafer with the target substrate, the target shape defining a shape of the near-field transducer or a shape larger than the near-field transducer shape.

4. The method of claim 1, wherein the first and second bonding layers comprise diffusion layers.

5. The method of claim 4, wherein the diffusion layers comprise at least one of Ti, Al, Au, Ag, Cu, Pt, Cr, Ta, W.

6. The method of claim 1, wherein the first and second bonding layers comprise dielectric bonding layers, the method further comprising activating mating surfaces of the dielectric bonding layers before flipping and joining the carrier wafer with the target substrate.

7. The method of claim 6, wherein the dielectric bonding layers comprise an oxide-to-oxide interface.

8. The method of claim 7, wherein the oxide-to-oxide interface comprises AlO or SiO2.

9. The method of claim 6, wherein activating the mating surfaces comprises treating the mating surfaces using plasma or ion beam of Ar, $O_2$, $N_2$, Ne, Xe, He, or Kr.

10. The method of claim 1, wherein the metal seed layer comprises Cu seed layer and the platinum group metal comprises Rh, Ir, or an alloy comprising one or more of these metals.

11. The method of claim 10, wherein the Cu seed layer comprises an epitaxial Cu seed layer and the carrier wafer is a silicon wafer, and forming the metal layer comprises metal-metal epitaxy on silicon using the epitaxial Cu seed layer.

\* \* \* \* \*